United States Patent [19]

Bauer et al.

[11] Patent Number: 4,791,301

[45] Date of Patent: Dec. 13, 1988

[54] DEVICE FOR THE INPUT OF A NOMINAL VALUE FOR THE IMPACT POINT OF AN ELECTRON BEAM ON A MEDIUM

[75] Inventors: Volker Bauer, Neuberg; Josef Heimerl, Linsengericht; Horst Ranke, Alzenau, all of Fed. Rep. of Germany

[73] Assignee: Leybold Aktiengesellschaft, Fed. Rep. of Germany

[21] Appl. No.: 924,255

[22] Filed: Oct. 28, 1986

[51] Int. Cl.$^4$ ............................. G01K 1/08; H01J 3/14
[52] U.S. Cl. ..................................... 250/397; 250/398; 250/492.1; 219/121.23
[58] Field of Search ................... 250/306, 310, 396 R, 250/396 ML, 357, 398, 492.1; 219/121 EP

[56] References Cited

U.S. PATENT DOCUMENTS

| | | | |
|---|---|---|---|
| 4,020,343 | 4/1977 | Shimaya et al. | 250/310 |
| 4,071,759 | 1/1978 | Namae | 250/310 |
| 4,105,937 | 8/1978 | Tuda et al. | 318/568 |
| 4,523,094 | 6/1985 | Rossow | 250/311 |

FOREIGN PATENT DOCUMENTS

| | | |
|---|---|---|
| 2821028 | 11/1978 | Fed. Rep. of Germany . |
| 2919419 | 12/1982 | Fed. Rep. of Germany . |
| 3218317 | 11/1983 | Fed. Rep. of Germany . |
| 1134416 | 11/1968 | United Kingdom . |

OTHER PUBLICATIONS

IBM Technical Disclosure Bulletin, "Electro-Optical Cursor Controller", vol. 27, No. 11, Apr. 1985.
IBM Technical Disclosure Bulletin "Position Detection on Static Displays", vol. 26, No. 3A, Aug., 1983.
Elektronik Informationen Nr. 1–1981, p. 209, Item 023.

Primary Examiner—Bruce C. Anderson
Attorney, Agent, or Firm—Steele, Gould & Fried

[57] ABSTRACT

The nominal position value for the impact point of an electron beam on a medium located in a crucible is input to a device having a screen on which the contours of the crucible are represented. Light pen means establish a plurality of nominal positions of impact of the electron beam within the represented contours of the crucible.

15 Claims, 3 Drawing Sheets

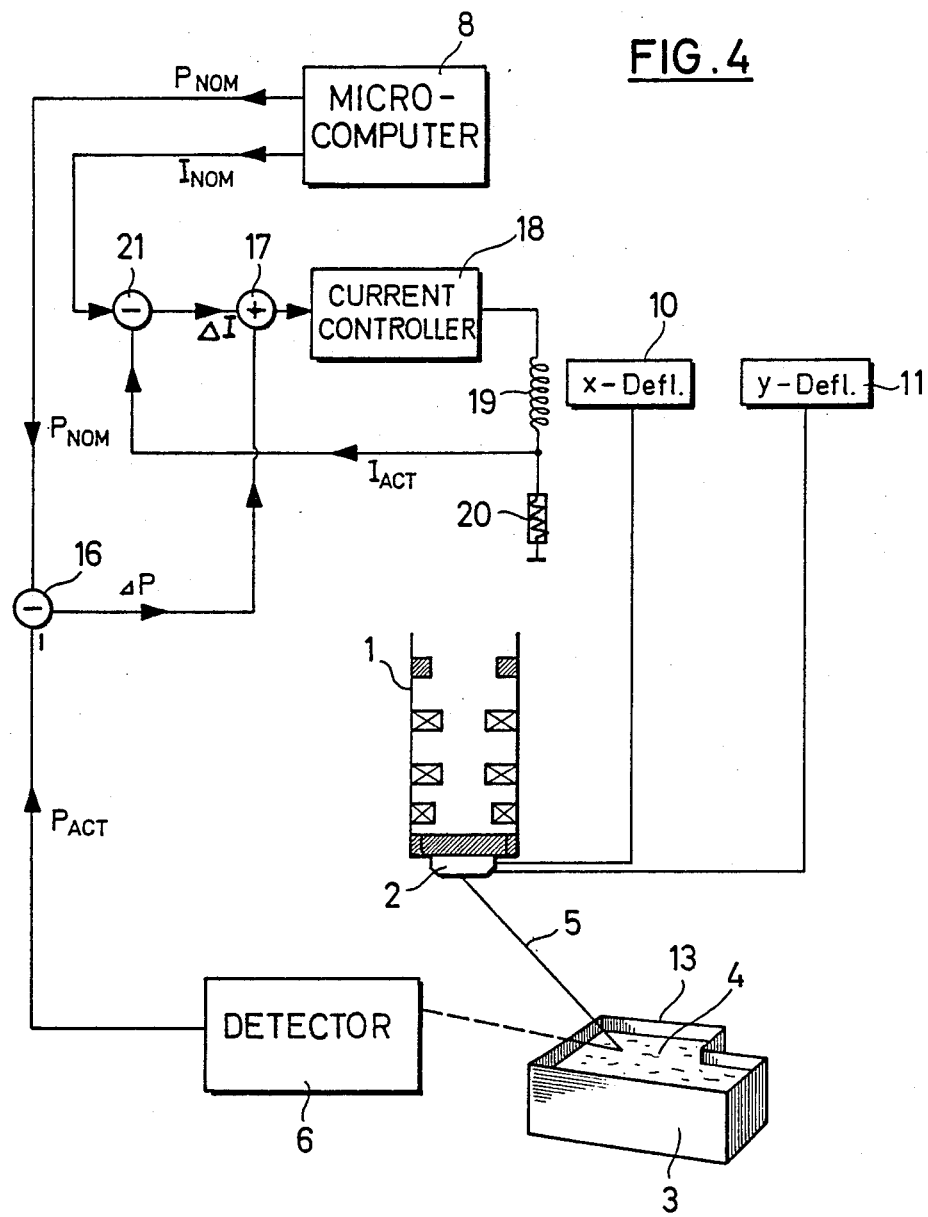

DEVICE FOR THE INPUT OF A NOMINAL VALUE FOR THE IMPACT POINT OF AN ELECTRON BEAM ON A MEDIUM

BACKGROUND

The invention concerns a device to initial aim or direct an electron beam in a crucible. During heating, melting or evaporation of metallic or other materials, high energy electron beams are often used, which impact onto the material to be heated, melted, or evaporated. Therefore, it is usually required that the electron beam be brought into predetermined positions in order that the attempted purpose be fulfilled.

The effect of electrical or magnetic fields, the change of which causes a change of the position of the electron beam, is utilized for the positioning of a electron beam. It is common to position the beam by means of adjustable currents which in turn build up a deflecting magnetic field. This technique is particularly advantageous. The adjustment is usually manually performed, hereby an operator observes the electron beam through a window and adjusts the currents required for the x position and the y position of the beams by adjusting two potentiometers.

If, within a crucible, several points of the medium are to be sequentially impacted by the electron beam, this type of manual adjustment is very time consuming. This is particularly true if the electron beam is to have different tarrying times at the various positions.

Such different tarrying times are required for specific applications, e.g., if several vapor sources are to be formed on the surface of the contents in one single evaporation crucible such that an electron beam is fired onto the surface of the contents of the crucible in specific surface patterns (DE-OS No. 28 12 285). In order to be able to simply preprogram the power input of the electron beam into a device of such nature, it is already known to represent this power input on a screen in the form of a bar diagram (DE-OS No. 33 30 092), whereby the bars in the bar diagram may be changed by means of a light stylus. However, in this case, the screen is not used for representation of specific coordinates in the plane or in the space.

OBJECTS AND SUMMARY OF THE INVENTION

Consequently, the purpose of the invention is to predetermine, in a simple manner, various nominal positions of an electron beam on the surface of a medium and to approach this nominal position with the electron beam automatically and sequentially.

The invention concerns a device for inputting a nominal position value for the impact point of an electron beam onto a medium which is located in a crucible. This device has a screen on which the contours of the crucible are represented. By means of a light stylus, various nominal positions can be established for the electron beam within the represented contours of the crucible.

With the present invention, various points on the surface of a material in a crucible can be automatically and precisely approached with only one electron beam including consideration of different tarrying times of the beam at the individual points. Hereby, the circulation time of the electron beam, i.e., the time required for it to return to the starting point, is extremely short.

BRIEF DESCRIPTION OF THE DRAWINGS

FIG. 4 is a schematic diagram of a control switching arrangement according to the invention, shown for control of the x position.

DETAILED DESCRIPTION OF THE PREFERRED EMBODIMENTS

Figure 1:
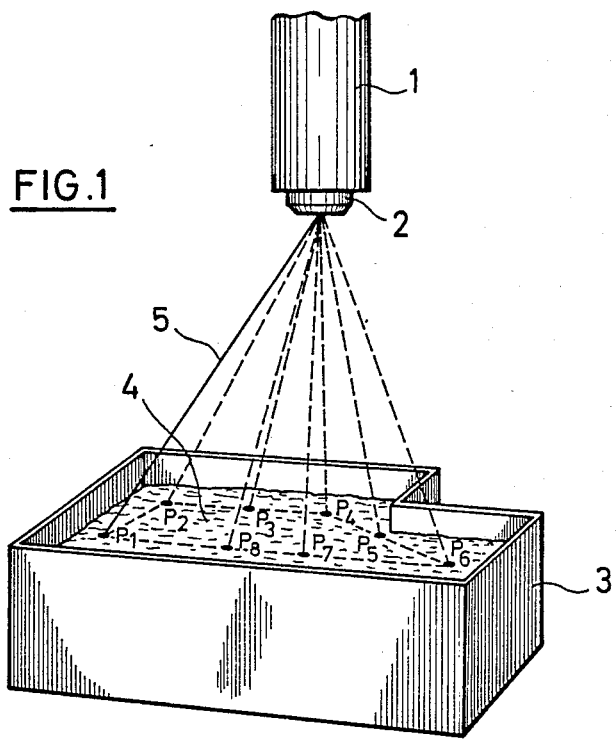
FIG. 1 illustrates a crucible with an electron gun arranged above the crucible.

FIG. 1 represents an electron beam gun 1 with a deflector system 2 above a crucible 3. In this crucible 3, there is a medium 4, which is heated by means of a electron beam 5. Thereby, the electron beam 5 is to be sequentially guided to the points $P_1 \ldots P_8$ and repeatedly run through the cycle of $P_1$.

FIG. 2 again shows the crucible, in a top view, namely on a larger scale. Here, one can again recognize the points $P_1 \ldots P_8$ which are to be sequentially approached by the electron beam. Next to these points, the related x, y coordinates are indicated, e.g., $x_1$, $y_1$, in order to express that these are approached by means of the x, y deflector system 2. In addition, each one of the points $P_1 \ldots P_8$ displays information on the applicable tarrying time of the electron beam 5. If the electron beam is moved from $P_1$ to $P_2$, it is guided to $P_2$ only on the basis of a position command $x_2$, $y_2$, i.e., currents $I_x$, $I_y$ affect the x, y deflector system 2, which leads the electron beam 5 to $P_2$ at an almost shocking speed; the time $t_{s1}$, which the electron beam 5 requires for the distance between $P_1$ and $P_2$, is practically limited by nothing but the inductivity of the deflector system 2. By preprogramming the currents $I_x$, $I_y$, the electron beam is not, however, guided very precisely to point $P_2$, but it may arrive at $P_2'$. This causes an error $\Delta S$. This error $\Delta S$ is equalized by means of a nominal/actual control, i.e., the beam 5 is moved to exactly the point $P_2$.

Consequently, there is no continuous control of the beam guidance from $P_1$ to $P_2$, but the beam 5 is guided directly to $P_2$ and corrected for the small deviation $\Delta S$ only thereafter. This shortens the correction time.

The same procedure is then also repeated when the beam moves from $P_2$ to $P_3$, from $P_3$ to $P_4$, etc.

During the first circulation of the electron beam 5 from $P_1$ to $P_8$, the tarrying times at $t_v1$, $t_v2 \ldots$ at $P_2$, $P_3$, etc. do not yet correspond to the final tarrying times but initial tarrying times amount to e.g., 10,000 times these final times.

During the second circulation of the electron beam 5, the tarrying times $t_v1$, $t_v2 \ldots t_v8$ amount to only 1,000 times the correct nominal value, etc., until finally the nominal position of the electron beam will be the actual tarrying time.

Hereby, it is achieved that for each run of the electron beam 5 through the nominal positions $P_1$, $P_2$, $P_3 \ldots P_8$, only minor corrections of the related current value are required.

Figure 3:
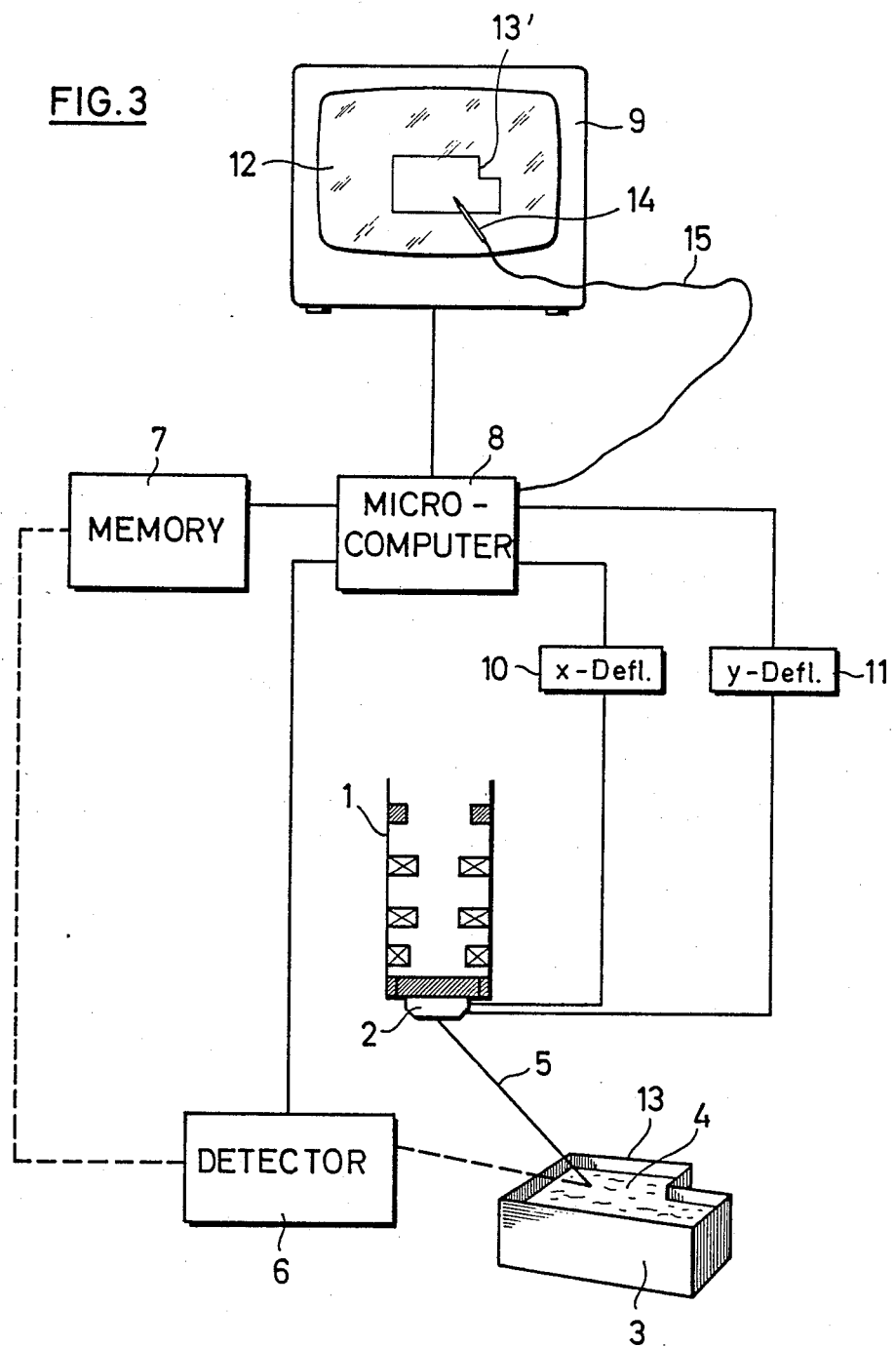
FIG. 3 is a representation of the principle of the arrangement according to the invention.

FIG. 3 shows a representation of the principle of the invention, in which one again recognizes the electron beam gun with the deflector system 2. The crucible 3 is arranged below the electron beam gun 1, and the contents 4 thereof are impacted by the electron beam 5. Next to the crucible 3 there is a sensor for actual position, or a detector 6, which identifies the impact point of the electron beam. This detector 6 may be an X-ray detector, as described in German Patent Application No. P 34 42 207.7.

From this detector 6, a connection leads to a memory 7 and to a microcomputer 8 which, in turn, is connected to a monitor 9 and an x deflection 10, as well as with a y deflection 11. These x/y deflections 10, 11 are connected to the deflection system 2.

The monitor 9 has a screen 12 which shows the edge 13 (border, rim or outer ridge) of the crucible as a contour 13'. By means of a light stylus 14, which is powered via the cable 15, it is possible to input nominal beam impact positions within the contour 13'.

At its front end, this light stylus has a sensor, by means of which the impact of an electron beam can be picked up by the monitor 9. If the electron beam is brought into a specific nominal position within the edge 13 of the crucible, it is then possible to indicate this nominal position within the representation 13' of the edge of the crucible 13 by means of the tip of the light stylus 14.

This tip is placed on the specific nominal position and with short intervals, it receives an impulse through the line by line sensing of the screen 12 by means of an electron beam from the monitor 9. This impulse is transmitted from the light stylus 14 to the microcomputer 8. In the microcomputer, the position of the tip of the light stylus 14 within the edges 13' can be detected with precision. The impulses transmitted from the light stylus 14 define the times at which the electron beam of the monitor 9 impacts on the tip of the light stylus. Since this time information can be utilized in order to scan the conditions of the related line and column deflection of the electron beam of the monitor, it is possible to recognize the x/y coordinates of the electron beam from the monitor. Those x/y coordinates for the contact point of the electron beam from the monitor, which have been detected by the microcomputer and which correspond to the nominal value of the position of the electron beam 5, are automatically stored in the memory 7 or in the microcomputer 8.

Figure 2:
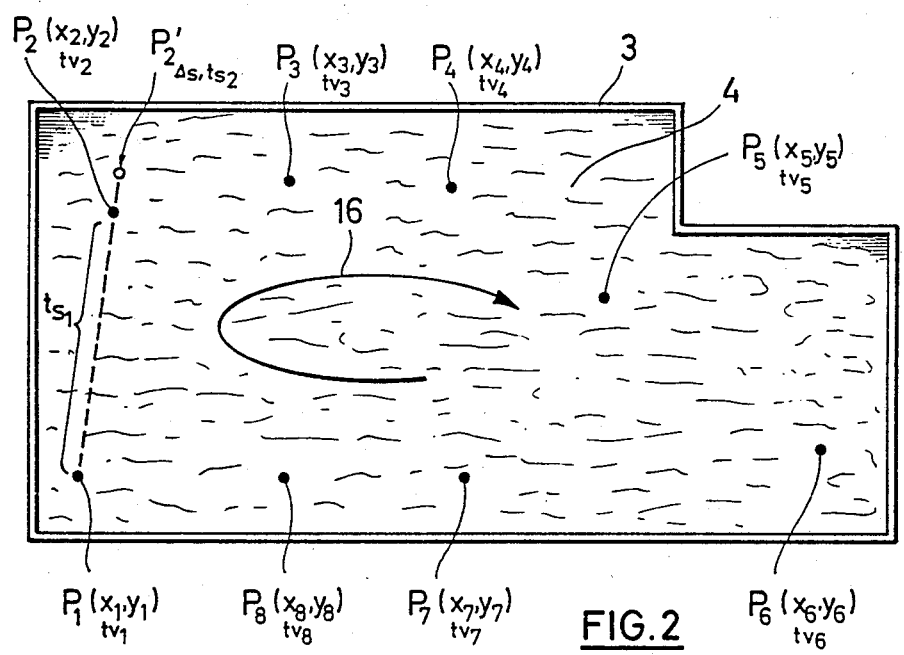
FIG. 2 is an enlarged top view of the crucible.

By means of the light stylus 14, it is possible to sequentially input and store several positions, according to approximately the pattern shown in FIG. 2. In addition to the nominal positions $P_1 \ldots P_8$, which are indicated to represent far more numerous nominal positions, e.g., 64, it is also possible to input the tarrying times $t_v 1 \ldots t_v 8$ assigned to the respective nominal positions, namely by means of a device which is not shown in FIG. 3.

These tarrying times can be input, e.g., by entering the applicable tarrying time on a keyboard of the microcomputer 8 and then depressing the "Enter" key when the tip of the light stylus 14 touches the screen 12.

When the nominal positions $P_1 \ldots P_8$ and the related tarrying times $t_v 1 \ldots t_v 8$ have been stored, the electron beam 5 can be guided into the predetermined positions via a microcomputer 8, via the x/y deflection 10, 11, and via the deflection system 2. In order to achieve a precise approach to the nominal positions, the actual position of the electron beam 5 is identified by the detector 6 and input into a memory 7 or directly into the microcomputer 8. By means of a control switching, the electron beam is brought from its actual position into the nominal position. Such a control switching is shown in FIG. 4, namely for the control of the x position only. The y position is set in the same manner. The monitor 9 and the memory 7 are not included in FIG. 4 since they are not necessary for the understanding of the control switching.

From this representation, one can recognize that the detector 6 feeds the actual position value $P_{act}$ of the impact point of the electron beam 5 onto the target material 4 to a subtraction point 16, where this actual value $P_{act}$ is subtracted from the nominal position value $P_{nom}$, which is input to the subtraction point 16 by the microcomputer 8. The deviation $\Delta P$ between actual and nominal position is fed to an adding point 17, the output signal of which arrives to a power regulator 18 (current controller), which in turn influences the x deflection vial a coil 19 and a resistor 20.

The actual value $I_{act}$ of the current flowing through the coil 19 is input to a subtraction point 21, where it is subtracted from the nominal current value $I_{nom}$ which is provided by the microcomputer 8. The deviation $\Delta I$ is then fed into the adding point 17, and the output signal from this adding point is transmitted to the current regulator 18.

Thus, the microcomputer 8 stores, e.g., two different types of nominal values: one, a specific number of points as current values, and the other, the same number of points as position values for the x/y coordinates.

At first, only the nominal value $I_{nom}$ is significant for the positioning of the electron beam 5, since actual or nominal values for position do not yet exist. Not until these are given, will $\Delta I$ and $\Delta P$ be utilized for correction purposes.

What is claimed is:

1. Device for input of a nominal position value for the impact point of an electron beam on a medium located in a crucible, said device comprising a screen on which the contours of the crucible are represented and light pen means for establishing a plurality of nominal positions of impact of the electron beam within the represented contours of the crucible.

2. Device as defined in claim 1, including means for determining the retention time of the electron beam at the respective nominal positions.

3. Device as defined in claim 1, wherein the light pen means for establishing the nominal positions includes a light stylus operable in conjunction with said screen.

4. Device as defined in claim 1, including a memory electrically coupled to the screen, in which data representing the contours of the crucible are stored.

5. Device as defined in claim 1, including a display device means for the displaying of the actual position of the impact point of the electron beam on the screen.

6. Device as defined in claim 1, including a deflector unit means for adjusting the impact point of the electron beam onto the medium by means of magnetic or electrical fields.

7. Device as defined in claim 1, wherein the actual position of the electron beam is represented on the screen.

8. Device as defined in claim 4, including means for storing, into said memory, data representing the contours of the crucible.

9. Device as defined in claim 4, wherein during a detection of the contours of a right-angled crucible, the electron beam is manually led to the crucible corners and a calculator device establishes the total contour between individual corner positions of the crucible by a linear interpolation means.

10. Device as defined in claim 4, including means for the direct input of a nominal x, y position and for generating corresponding deflector currents in a deflector system for said electron beam, the electron beam is immediately and at least approximately directed into a nominal position by the means for direct input.

11. Device as defined in claim 10, including a control device for comparing an actual impact position of said electron beam with an exact nominal position and for activating said deflector system to move said electron beam from said actual impact position to said exact nominal position, said actual impact position determined by a sensor electrically coupled to said control device.

12. Device as defined in claim 1, wherein several impact points of the electron beam are stored in a storage means as nominal values and that these impact points are sequentially approached by the electron beam, whereby the time T required for the approach to all points is also stored in said storage means.

13. Device as defined in claim 1, wherein after the input of the nominal positions in an input and storage means and a respective corresponding tarrying time for each position, the nominal positions of the beam are first run via a position run means with a $10^4$ tarrying time, whereby current values, input into a magnetic deflector unit by a means for moving the beam, are related to actual position coordinates of the electron beam and are corrected with respect to the nominal positions by a means for correcting.

14. Device as defined in claim 13, wherein after completion of a first correction phase, the position run means performs a position run with a tarrying time of $10^3$.

15. Device as defined in claim 14, wherein upon completion of a second correction phase, the position run means performs a run with a $10^2$ tarrying time.

* * * * *

UNITED STATES PATENT AND TRADEMARK OFFICE
CERTIFICATE OF CORRECTION

PATENT NO. : 4,791,301
DATED : December 13, 1988
INVENTOR(S) : Bauer et al

It is certified that error appears in the above-identified patent and that said Letters Patent is hereby corrected as shown below:

Insert on the cover page, left column, the following: --

-- [30] Foreign Application Priority Data

November 2, 1985 [DE] Federal Republic of Germany

3538857 [U]         --.

Signed and Sealed this

Fifteenth Day of August, 1989

Attest:

DONALD J. QUIGG

Attesting Officer

Commissioner of Patents and Trademarks